United States Patent [19]

Matsumoto et al.

[11] Patent Number: 5,023,654

[45] Date of Patent: Jun. 11, 1991

[54] THERMAL FIXING DEVICE FOR IMAGE RECORDING APPARATUS

[75] Inventors: Yumio Matsumoto, Kasugai; Yasuo Kimura, Ichinomiya; Osamu Takagi, Nagoya; Yuji Asano, Nagoya; Takemi Yamamoto, Nagoya; Takashi Nakata, Nagoya, all of Japan

[73] Assignee: Brother Kogyo Kabushiki Kaisha, Nagoya, Japan

[21] Appl. No.: 429,491

[22] Filed: Oct. 31, 1989

[30] Foreign Application Priority Data

Oct. 31, 1988 [JP] Japan .................... 63-142154[U]
Oct. 31, 1988 [JP] Japan ................... 63-275319
Dec. 16, 1988 [JP] Japan ................... 63-318874
Dec. 19, 1988 [JP] Japan ................... 63-321337
Jan. 30, 1989 [JP] Japan ................... 1-20510
Jan. 31, 1989 [JP] Japan ................... 1-23047

[51] Int. Cl.$^5$ .......................... G03B 27/52
[52] U.S. Cl. ........................ 355/27; 355/30; 355/106
[58] Field of Search ............. 355/30, 32, 27, 106, 355/100, 286–289

[56] References Cited

U.S. PATENT DOCUMENTS

| 3,914,046 | 10/1975 | Tanaka et al. | 355/30 X |
| 4,202,618 | 5/1980 | Waschk et al. | 355/30 X |
| 4,240,072 | 12/1980 | Fowler | 361/31 X |
| 4,864,356 | 9/1989 | Asano et al. | 355/30 |
| 4,893,147 | 1/1990 | Tanabe et al. | 355/27 |

FOREIGN PATENT DOCUMENTS 6057061 12/1982 Japan .
61-11930 1/1986 Japan .
62-154455 9/1987 Japan .

Primary Examiner—L. T. Hix
Assistant Examiner—D. Rutledge

[57] ABSTRACT

A thermal fixing device for an image forming apparatus is disclosed which comprises a heater for heating a piece of developer sheet to thermally fix and accelerate coloring of the image on the developer sheet, a sheet delivery path along which the developer sheet is delivered, a cover casing for substantially covering the heater, and a suction/discharge unit for sucking/discharging a gas generated from the developer sheet by the heater. The suction/discharge unit is connected to the cover casing.

23 Claims, 6 Drawing Sheets

THERMAL FIXING DEVICE FOR IMAGE RECORDING APPARATUS

BACKGROUND OF THE INVENTION

The present invention relates to a thermal fixing device for an image recording apparatus in which an image formed on a sheet is thermally fixed on the sheet.

In a conventional copying machine, in the case where a latent image formed on a photo-sensitive, pressure-sensitive sheet is developed and transferred to a developer sheet to provide a visible image, the photo-sensitive, pressure-sensitive sheet and the developer sheet are superimposed one on the other and pressure is applied thereto. Thereafter, the developer sheet is blown by a heated air stream with a dryer type heating unit to thereby thermally fix the image thereon and accelerate coloring of the image while traveling the developer sheet.

However, in this case, when the developer material coated on the developer sheet is heated, a gas having an unplesant smell is generated from the developer sheet. The conventional apparatus is designed so that the gas is not diffused out of the apparatus.

SUMMARY OF THE INVENTION

Accordingly, a primary object of the present invention is to provide a thermal image fixing device for an image recording apparatus, which may remove unpleasant smelling components contained in the discharge gas.

Another object of the invention is to provide a thermal fixing device which restricts an operational time period of a suction means for removing a gas generated from a developer sheet by heating, to thereby save a consumption power.

Another object of the invention is to provide a thermal fixing device in which the gas suction operation is stopped during the starting operation of the thermal fixing device to thereby rapidly perform the temperature elevating operation without consuming the energy in vain, and which device may effectively utilize the suction means for changing the temperature within the thermal fixing means in the case where the heating temperature of the heating means may be selectively set at one in response to a kind of the sheet.

Still another object of the invention is to provide an image recording apparatus which may warn the operator to replace the filter whose service life is consumed.

Yet another object of the invention is to provide a thermal fixing device which may detect the provision of the filter based upon the temperature increasing rate upstream of the filter, and warn no filter to the operator.

To achieve the above and other objects of the invention, there is provided a thermal fixing device for thermally fixing and accelerating coloring of an image formed on a sheet, comprising a device body incorporating heating means therein and provided with an inlet and an outlet through which the sheet is delivered, suction means connected to the inlet and outlet for sucking a gas, generated from the sheet when heated, through the inlet and outlet and vicinities of the inlet and outlet, thereby discharging the gas to an outside of the device body, and a filter disposed on a discharge side of the suction means for removing an odor of the gas.

According to another aspect of the invention, there is provided a thermal fixing device for heating a developer sheet having a substrate on which a developer material is coated and carrying an image formed thereon by the reaction of the developer material with a chromogenic material selectively adhered to the developer material coated substrate, comprising removing means for removing a gas generated due to a temperature increase of the developer material coated on the substrate. The device may further comprise heating means for spraying a heated air to the developer sheet, wherein the removing means is mounted in a path of the air sprayed onto the developer sheet by the heating means, the air is leaked through the path to the outside.

According to still another aspect of the invention, there is provided a thermal fixing device for thermally fixing and accelerating coloring of an image formed on a sheet, comprising delivery means for delivering the sheet along a delivery path, heating means disposed on the delivery path of the sheet for heating the sheet, a device body incorporating the heating means therein and provided with an inlet and an outlet through which the sheet is delivered, suction means connected to the inlet and outlet for sucking a gas, generated from the sheet when heated, through the inlet and outlet and vicinities of the inlet and outlet, thereby discharging the gas to an outside of the device body, temperature setting means for selectively setting one of a plurality of heating temperatures, and control means for controlling the heating means and the suction means in response to the temperature set by the setting means.

According to further aspect of the invention, there is provided a thermal fixing device for thermally fixing and accelerating coloring of an image formed on a sheet, comprising delivery means for delivering the sheet along a delivery path, heating means disposed on the delivery path of the sheet for heating the sheet, a device body incorporating the heating means therein and provided with an inlet and an outlet through which the sheet is delivered, suction means connected to the inlet and outlet for sucking a gas, generated from the sheet when heated, through the inlet and outlet and vicinities of the inlet and outlet, thereby discharging the gas to an outside of the device body, and control means for operating the suction means only when the sheet passes through the device body in accordance with the operation of the delivery means.

According to still further aspect of the invention, there is provided an image forming apparatus wherein a gas containing odorous components is generated during an image forming process, comprising a filter disposed in a vent path of the gas, means for detecting that a service life of the filter is ended, and processor means for carrying out a predetermined process in response to a result of a detection of the detecting means.

According to yet another aspect of the invention, there is provided a thermal fixing device comprising a device body covering a delivery path of a sheet and provided with an inlet and an outlet through which the sheet is delivered, heating means for heating an interior of the device body to thermally fix an image formed on the sheet, discharge means connected to the inlet and outlet for forcibly discharging a gas generated when the sheet is heated to the outside of the device body, a deodorizing filter mounted on the discharge means for removing odors contained in the gas, temperature detecting means disposed upstream of the deodorizing filter, calculating means for calculating a temperature increasing rate within the device body on the basis of a detection result of the temperature detecting means, judging mean for judging that no deodorizing filter is mounted in the case based on a calculating result of the calculating means, and warning mean for warning, on the basis of a judging result of the judging means, the fact that the deodorizing filter is not mounted.

According to another aspect of the invention, there is provided a thermal fixing device for thermally fixing and accelerating coloring of an image on a developer sheet, comprising means for heating the developer sheet to thermally fix and accelerate coloring of the image on the developer sheet, delivery means for delivering the developer sheet through the heating means, covering means for substantially covering the heating means and discharge means for discharging a gas generated from the developer sheet by the heating means, the discharge means being connected to the covering means.

The above and other objects, features and advantages of the present invention will become more apparent from the following description when taken in conjunction with the accompanying drawings in which preferred embodiments of the present invention are shown by way of illustrative examples.

DETAILED DESCRIPTION OF THE PREFERRED EMBODIMENTS

The present invention will now be described with reference to the accompanying drawings.

Figure 1:
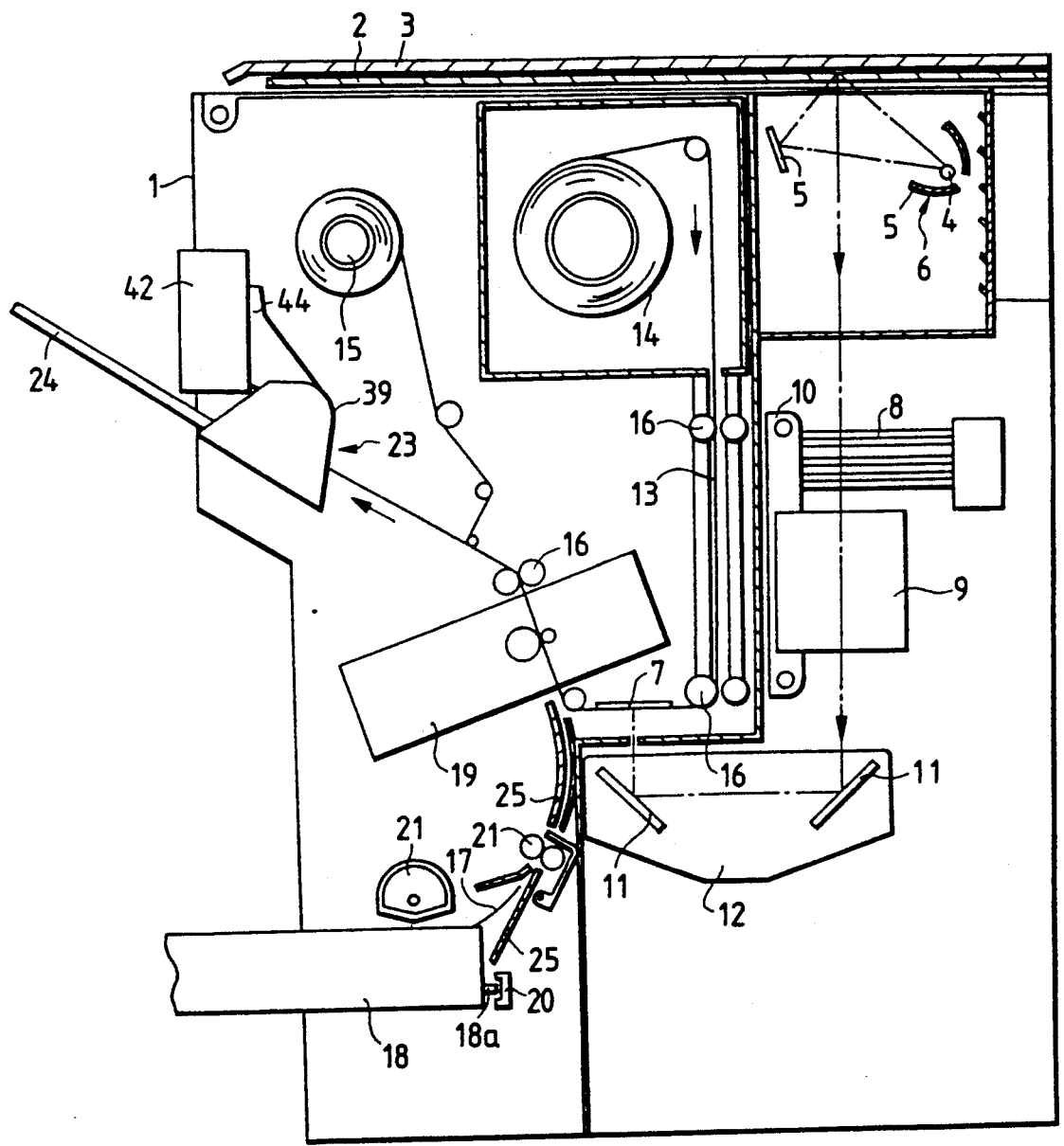
FIG. 1 is a schematic sectional view showing a copying machine to which the present invention is applied.

As shown in FIG. 1, on a top portion of a copying machine 1, there are provided an original plate glass 2 on which an original is to be laid, and a cover 3 movable rightwardly and leftwardly for opening/closing the original base glass 2. Under the original base glass 2, there is provided a light source 6 that is composed of a halogen lamp 4 extending in a direction perpendicular to the direction of movement of the original base glass 2 for irradiating light onto the original on the original base glass 2 and reflector mirrors 5 for reflecting the light for the halogen lamp 4 toward the original base glass 2. During the irradiation of the light source 6, the original base glass 2 moves rightwardly and leftwardly, whereby the original as a whole is irradiated.

On the other hand, an exposure base 7 is provided substantially in the middle portion of the copying machine 1. A set of filters 8 for adjusting a tone of the copied image and a condenser lens 9 are interposed between the light source 6 and the exposure base 7 and are supported by a mounting plate 10. A pair of reflecting mirrors 11 for adjusting an optical path length and a focus are pivotally supported in a positionally adjustable fashion by a mounting plate 12 between the condenser lens 9 and the exposure base 7. After the light has been projected onto the original, the light reflected from the original is led to the exposure base 7 via the filters 8, the condenser lens 9 and the reflecting mirrors 11.

In an inner upper portion of the copying machine 1, a cartridge 14 is detachably encased, and a takeup shaft 15 is rotatably supported in place. An elongated microcapsule sheet 13 that carries an immerse number of microcapsules encapsulating chromogenic material for color copying is encased in the form of a roll in the cartridge 14. After the microcapsule paper 13 has been drawn from the cartridge 14 by the rotation of a plurality of feed rollers 16, the sheet is wound around the takeup shaft 15, whereupon a part of the sheet 13 traveling along the lower surface of the exposure base 7 is exposed to light to thereby form a latent image of the original.

Below the exposure base 7, a cassette 18 for encasing a stack of cut developer sheets 17 having a substrate made of paper or transparent plastic used for an overhead projector (OHP) is detachably mounted in the copying machine 1. A pressure development unit 19 is interposed between the exposure base 7 and the takeup shaft 15. With such an arrangement, the exposed region of the microcapsule paper 13 and the developer paper 17 or developer sheet (hereinafter simply referred to as "developer sheet 17") are brought into pressing contact with each other within the pressure development unit 19, so that a color image is formed on the developer sheet 17 in accordance with the latent image on the microcapsule sheet 13. Also, a projection 18a for detecting a size of the developer sheet 17 is provided on the cassette 18. In association with this, a judging means 20 for judging the size of the developer sheet 17 in accordance with the size of the projection 18a is provided in the copying machine 1.

Between the cassette 18 and the pressure development unit 19, there are provided a plurality of feed rollers 21 for feeding the developer sheet 17 toward the pressure development unit 19 and paper guides 25. On the paper discharge side of the pressure development unit 19, there is provided a peeling roller 22 for peeling the developer sheet 17 away from the microcapsule sheet 13. Down stream of the peeling rollers 22, a sheet heating unit 23 is provided for thermally fixing the image formed on the developer sheet 17. The developer sheet 17 discharged from the sheet heating unit 23 is received on a tray 24. Herein, the expression "thermal fixing" is used to refer to not only thermally fixing the image on a sheet or substrate but also accelerating the coloring of the image by heating the substrate on which the image is formed.

In operation, for obtaining a color copy with the copying machine, when a start button (not shown) is depressed, the original base glass 2 is moved toward a rightmost movement end, and the left end of the original is located to face the halogen lamp 4 of the light source 6. Thereafter, the halogen lamp 4 is turned on. Under this condition, the original base glass 2 is moved leftward back to the initial position, thereby completing the irradiation of the original by the light.

During the light-irradiation, the microcapsule sheet 13 is moved past the exposure base 7 at the same speed as that of the original base glass 2. As a result, the latent image of the original is formed on the microcapsule sheet 13 by the reflected light from the original. On the other hand, the developer sheet 17 is moved from the cassette 18 toward the pressure development unit 19 in synchronism with the backward, leftward movement of the original base glass 2. The exposed region of the microcapsule sheet 13 is brought into pressing contact with the developer sheet 17, thereby forming a color image on the developer sheet 17. Thereafter, the developer sheet 17 is led into the sheet heating unit 23 by the feed rollers 16 and the like. The image is thermally fixed by the internal heat of the heating unit 23. Then, the developer sheet 17 is discharged onto the tray 24.

The thermal fixing unit (sheet heating unit) 23 shown in FIG. 1 will be described in more detail.

Figure 2:
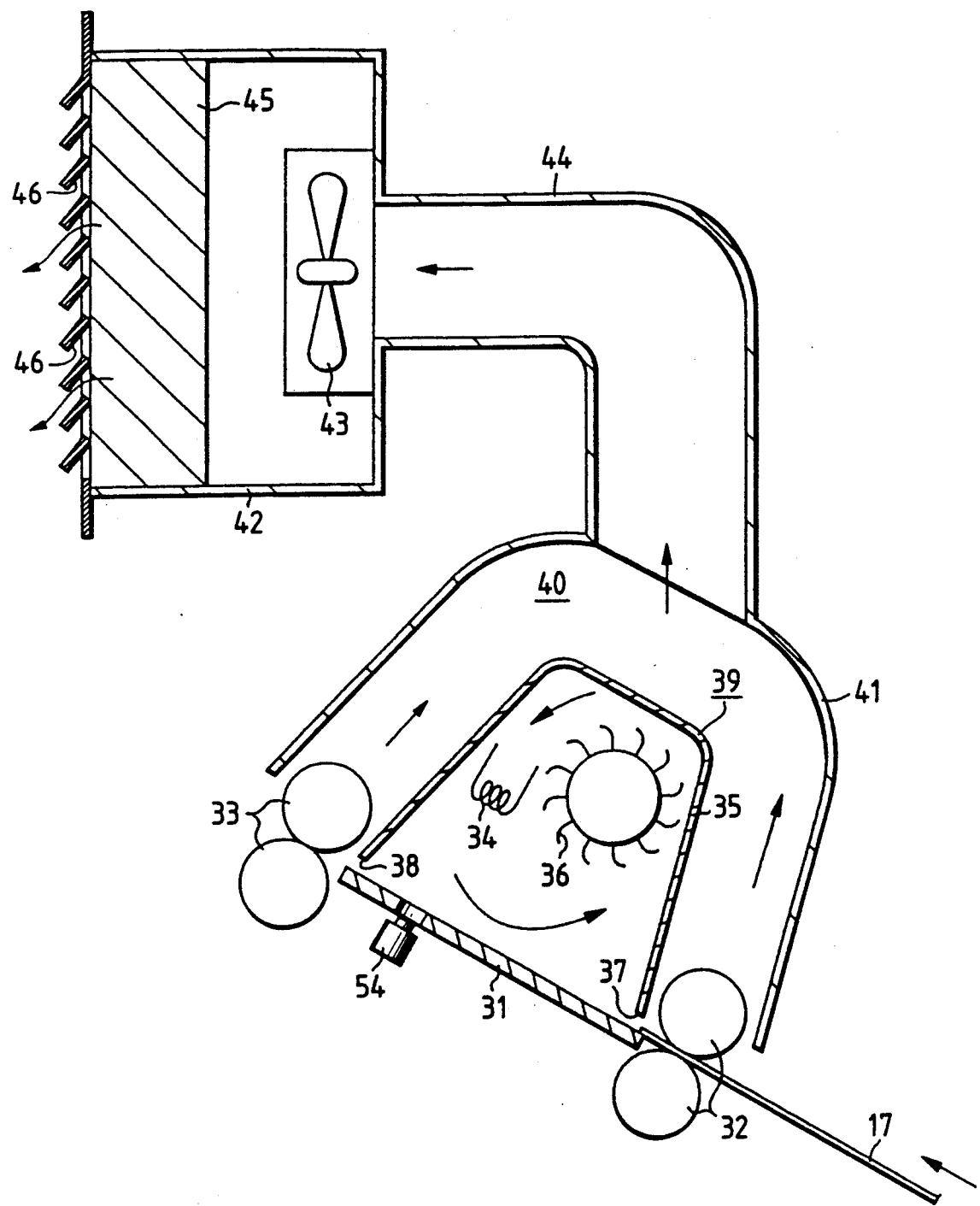
FIG. 2 is a schematic sectional view showing a heating means and a suction /discharge means in accordance with one embodiment of the invention.
Figure 3:
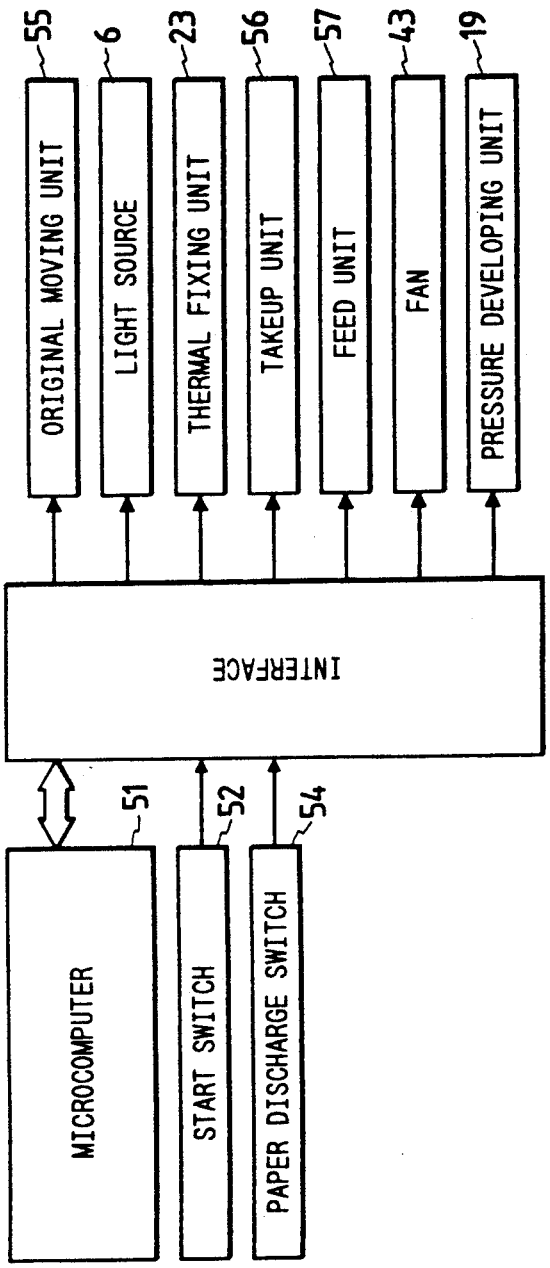
FIG. 3 is a block diagram showing a control system according to the present invention.

As shown in FIG. 2, a ferric guide plate 31 is disposed in the delivery path of the developer sheet 17. A pair of feed-in rollers 32 and a pair of feed-out rollers 33 are rotatably provided on the sheet feed-in and feed-out sides of the guide plate 31 with their rotary axes perpendicular to the delivery path, respectively. Above the guide plate 31, on the feed-out side, there is provided a heating means 34 having a coiled Nichrome wire. When the heating means 34 is energized, the ambient air is heated.

Above the guide plate 31, there is provided a casing 35 for covering the heating means 34. On the feed-in side of the heating means 34, there is provided a cross-flow fan 36 rotatable about a rotary axis perpendicular to the delivery path. According to the rotation of the fan 36, the heated air within the casing 35 is recirculated in a direction indicated by arrows in FIG. 2. Also, an inlet 37 and an outlet 38 for the developer sheet 17 are provided between the casing 35 and the guide plate 31. A fixing unit body 39 is composed of the guide plate 31 and the casing 35.

A cover 41 for substantially covering an overall outline of the body 39 and for forming an air path 40 in communication with the inlet 37 and the outlet 38 is provided at the body 39. Also, on the upper side of the body 39, a support frame 42 is mounted within the copying machine body 1. A suction means such as a fan 43 for sucking gas generated from the developer sheet 17 due to the heating of the developer sheet 17 is rotatably provided within the support frame 42. A suction side of the fan 43 is connected to the air path 40 through a duct 44.

In the support frame 42, a filter 45 made of active carbon or the like for removing an unplesant smelling gas is provided on the discharge side of the fan 43. A discharge port 46 is formed close to the filter 45 in the frame 42.

When the image on the developer sheet 17 is to be thermally fixed by the thermal fixing unit 23, the heating means 34 is energized, and the cross-flow fan 36 is rotated to form the heated air flow within the body 39. When the developer sheet 17 passes through the inlet 37 and the outlet 38 of the body 39 in accordance with the rotation of the feed-in rollers and the feed-out rollers, the image is thermally fixed by the heated air flow.

On the other hand, prior to the thermal fixing operation, when the leading end of the developer sheet 17 is fed to a predetermined position downstream of the feed-in rollers, the rotation of the fan 43 is started. The suction force of the fan 43 causes the air within the body 39 to enter into the filter 45 through the inlet 37, the outlet 38, the air path 40 and the duct 44 and exit through the discharge port 46. When the developer sheet 17 is almost fed out from the body 39, the rotation of the fan 43 is stopped.

Accordingly, during the thermal fixing operation, the odor of the gas generated from the developer agent by the heating of the developer sheet 17 is removed through the filter 45 without fail. The air that contains no smell is discharged from the discharge port 46. Also, in the foregoing embodiment, since the fan 43 is connected to the inlet 37 and the outlet 38 for the developer sheet 17 and to their vicinity, there is no need to specially machine the body 39.

Incidentally, it is apparent that the invention is not limited to the specific embodiment and it is possible to dispense with the duct 44. It is also possible to apply the invention to a monochromatic copying machine.

As described above, according to the foregoing embodiment, it is possible to remove an odor of the gas generated from the developer sheet due to the heating of the sheet.

A control system for the copying machine shown in FIGS. 1 and 2 will now be described. According to the control system, the operational period of the suction means for removing the odor of the gas generated from the developer sheet 17 is limited to thereby save a consumed electric power.

The copying machine is provided with a microcomputer 51 into which is inputted through an input/output interface 53 a copy starting signal in accordance with an operation of a start switch 52. A paper discharge switch 54 is provided close to the feed-out rollers 33 below the guide plate 31 (see FIG. 1). When the trailing edge of the developer sheet 17 has passed through the paper discharge switch 54, an output signal from the switch 54 is inputted into the microcomputer 51 through the interface 53.

Connected to the above-described microcomputer 51 through the input/output interface 53 and a drive circuit (not shown) are an original moving unit 55 for moving the original base glass 2, the light source 6, the pressure developing unit 19, the thermal fixing unit 23, the takeup unit having feed rollers 21 and the fan 43, respectively. The microcomputer 51 controls the operations of the respective components in accordance with the input signals from the switches 52 and 54 and a timing chart shown in FIG. 4.

For forming a color copy with the thus constructed copying machine, when the start switch 52 is operated, the microcomputer 51 controls the original moving unit 55 to move it toward the right movement end. At the same time, the feeding rollers of a feed unit 57 are operated to move the developer sheet 17 to the inlet portion of the pressure developing unit 19.

When the left end of the original is arranged to face the halogen lamp 4 of the light source 6, the microcomputer turns the halogen lamp 4 on. Under this condition, the original base glass 2 is moved leftwardly and the light is irradiated onto the original.

During the irradiation, the microcomputer 51 rotates the takeup shaft 15, and moves the microcapsule sheet 13 on the exposure base 7 to the takeup side at the same speed as that of the original base glass 2. As a result, the latent image of the original is gradually formed on the microcapsule sheet 13 by the reflective light from the original. In accordance with the operation of the takeup unit 56, the microcapsule sheet 13 and the developer sheet 17 are moved to the pressure developing unit 19 with leading edges of both the sheets being in coincidence with each other. As a result, the exposed region of the microcapsule sheet 13 is brought into pressing contact with the developer sheet 17 to form a color image on the developer sheet 17.

The developer sheet 17 peeled from the microcapsule sheet 13 by the peeling roller 22 in accordance with the operation of the takeup unit 56 is gradually introduced into the thermal fixing unit 23 from its leading edge. At this time, the microcomputer 51 controls the operation of the thermal fixing unit 23 to recirculate the heated air within the thermal fixing unit 23. Thus, the image is fixed on the developer sheet 17 after which the developer sheet 17 is discharged onto the tray 24.

Figure 4:
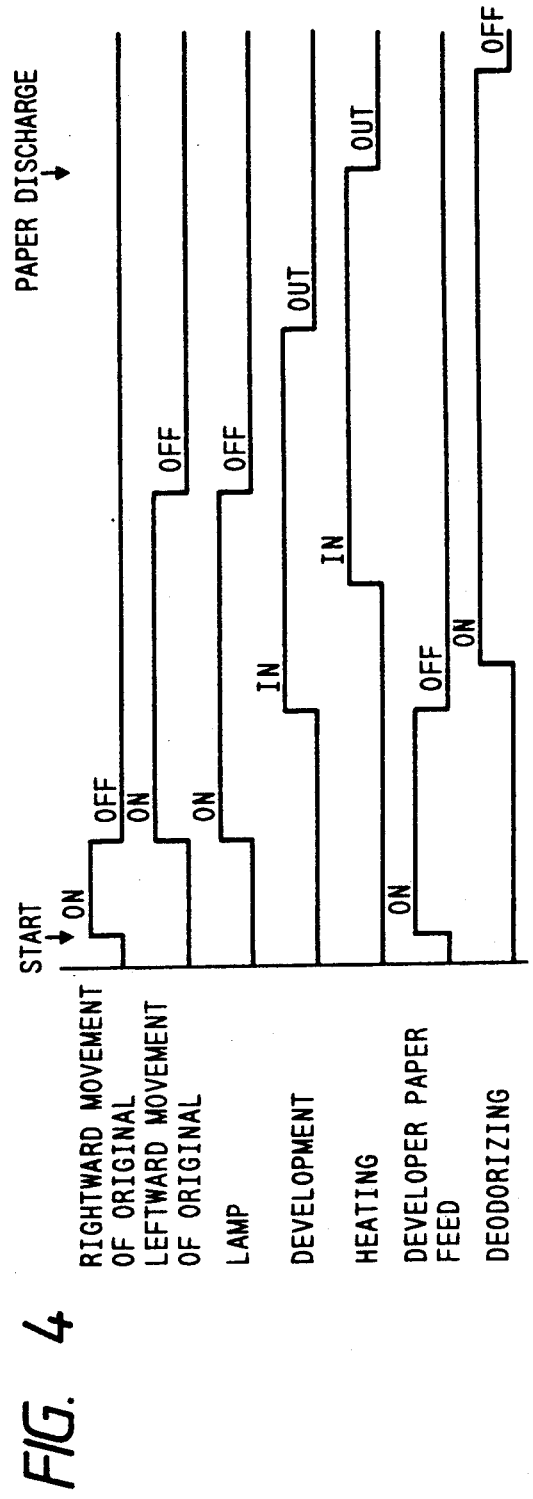
FIG. 4 is a timing chart showing an operation of the copying machine according to the invention.

For the thermal fixing of the developer sheet 17, as shown in FIG. 4, at a time before the developer sheet 17 is introduced into the thermal fixing unit 23, the microcomputer 51 starts the rotation of the fan 43. Then, at a time after the trailing edge of the developer sheet 17 has passed through the paper discharge switch 54, the microcomputer 51 stops the rotation of the fan 43.

During the rotation of the fan 43, the air within the casing 39 of the thermal fixing unit 23 is introduced into the filter 45 through the inlet 37 and outlet 38 and through the air path 40 and the duct 44 and is discharged from the discharge port 46. Accordingly, the odor contained in the gas generated from the developer agent due to the heating of the developer sheet 17 is removed by the filter 45 without fail, so that no odorous air is discharged from the port 46.

As described above, according to the system, it is possible to remove the odor of the gas generated from the developer sheet 17 due to the heating of the developer sheet 17 without fail and to limit the operational time of the fan 43 needed to remove the odor to the passage of the developer sheet 17 through the body 39, thereby saving the consumption power and also preventing the heat of the interior of the thermal fixing unit 23 from leaking to the outside.

It is apparent that various modifications are possible for those skilled in the art. For instance, the filter 45 may be formed outside of the copying machine body.

Figure 6:
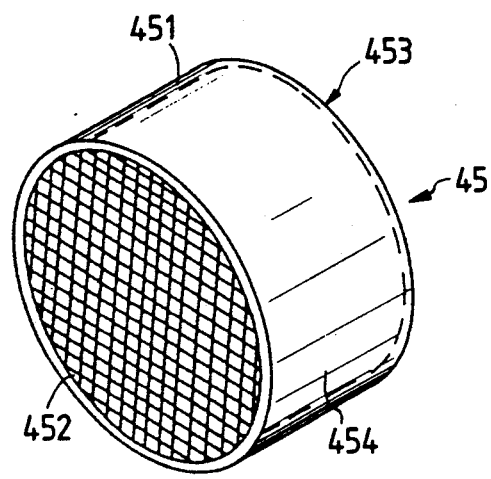
FIG. 6 is a perspective view showing a filter according to the invention.
Figure 5:
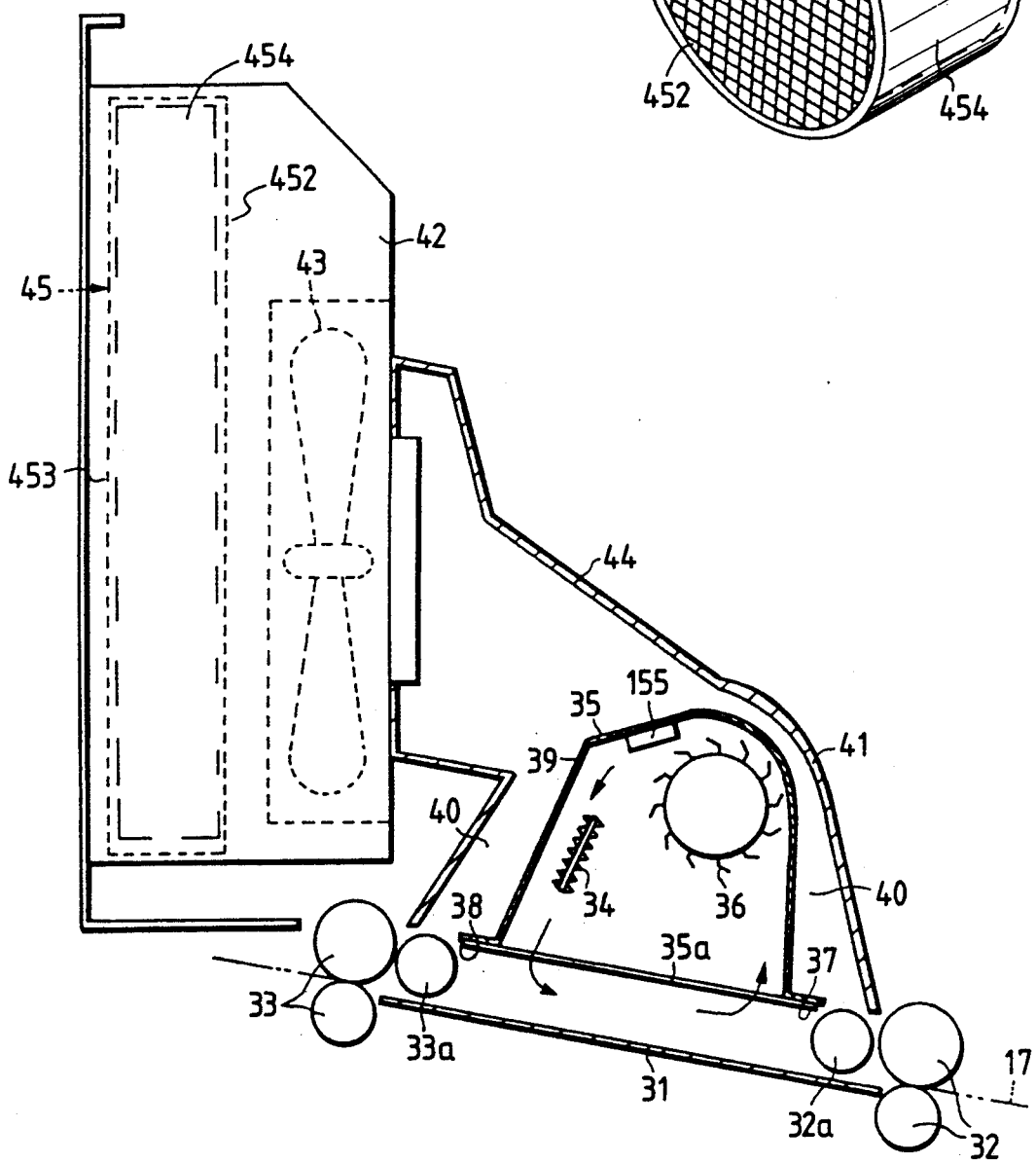
FIG. 5 is a schematic sectional view showing a heating means and a suction/discharge means according to another embodiment of the invention.

FIGS. 5 and 6 show a modification of the thermal fixing unit having a filter unit according to the present invention, in which like reference numerals are used to designate like components.

A casing 35 for covering a heater 34 is disposed over the guide plate 31 in the same manner. A shielding plate 35a having a number of heat ray permeation holes such as a mesh is provided on a lower opening of the casing 35. A blower fan composed of a cross-flow fan 36 rotatable about an axis perpendicular to the delivery path is provided on the feed-in side of the heater 34. In accordance with the rotation of the fan 36, the heated air within the casing 35 is recirculated in a direction indicated by arrows in FIG. 5. Also, the inlet 37 and outlet 38 for the developer sheet 17 are formed between the casing 35 and the guide plate 31. Heat insulating rollers 32a and 33a for insulating space between the rollers 32 and 33 and the inlet 37 and outlet 38, respectively, are rotatably provided close to and inside of the rollers 32 and 33. The thermal fixing unit body 39 is composed of the guide plate 31 and the casing 35.

A cover 41 is provided for covering the outline of the body 39 and for defining air paths 40 in communication with the inlet 37 and outlet 38. Above the body 39, a hollow support frame 42 is provided within the copying machine body 1. A deodorizer fan 43 for sucking the gas generated from the developer sheet 17 by the heating of the developer sheet 17 is rotatably disposed within the support frame 42. The suction side of the fan 43 is connected to the air paths 40 through a duct 44.

A filter 45 is mounted between the discharge port and the fan 43 within the support frame 42. The fan 43 and the filter 45 are used to constitute a suction means.

FIG. 6 shows details of the filter 45. Metallic meshes 452 and 453 are provided as upper and lower surfaces of a cylindrical outer frame 451. Papers having high permeation are attached to insides of the metallic meshes 452 and 453. The interior of the cylindrical frame 451 is filled with deodorizer 454. According to this modification, the developer sheet 17 will generate the odorous gas by heating. The components of the gas are absorbed by the odorizer 454. The filter 45 is mounted in the frame 42 with one mesh 452 facing the fan 43 and the other mesh 453 in contact with the ambient atmosphere without any gap.

Figure 7:
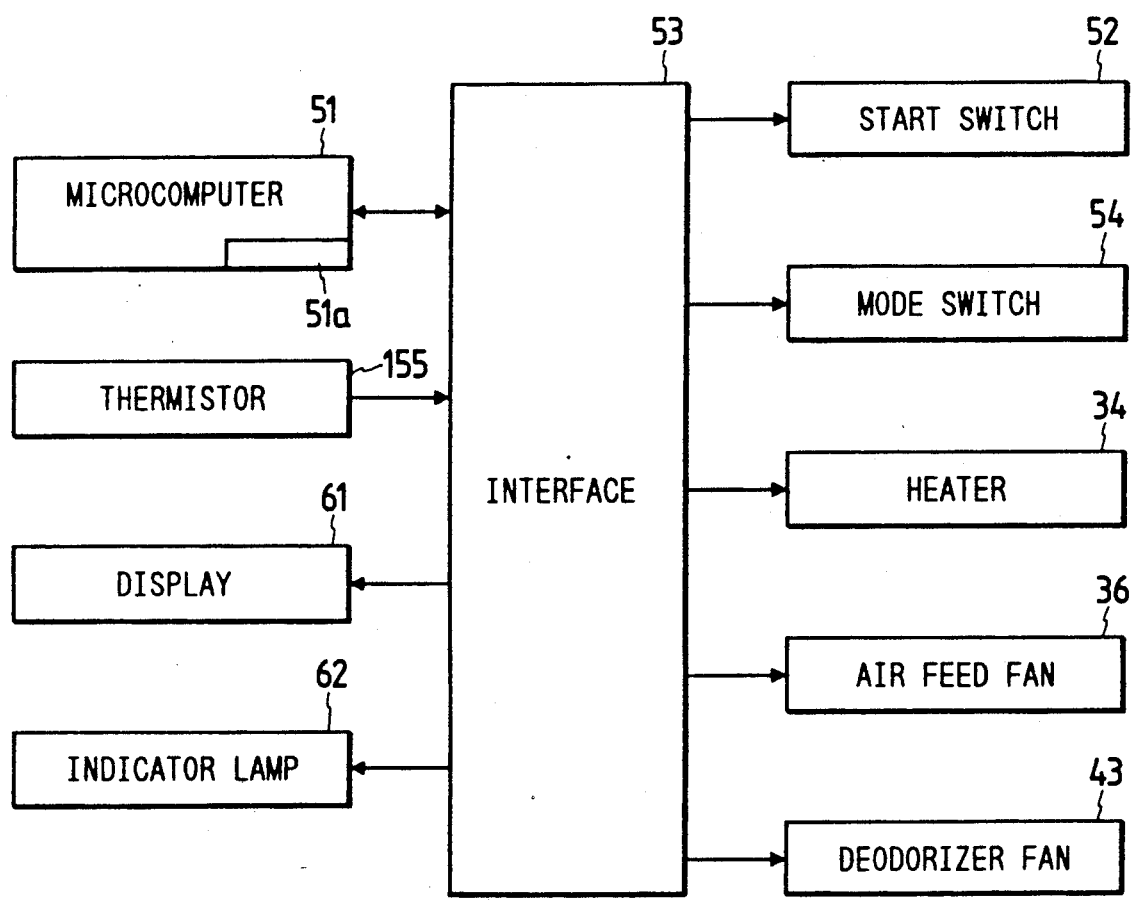
FIG. 7 is a block diagram showing another control system according to the present invention.

Furthermore, the copying machine according to this modification, as shown in FIG. 7, has a microcomputer 51 to which is connected through an interface 53 a start switch 52 for outputting a copy start signal. Also, a mode changing switch 54 is connected through the interface 53 to the microcomputer 51. The operation of the switch 54 sets three different modes of heating temperature.

The three different modes are a low shiny mode (heating temperature of 13° C.), a high shiny mode (heating temperature of 145° C.) and an OHP mode (heating temperature 160° C.). The low and high shiny modes are selected for making a difference in shine during copying using an ordinary developer sheet 17. The OHP mode is selected for using an OHP sheet to which a developer is applied. A thermistor 155 is mounted in an inner wall of the casing 35 for outputting a signal in response to the temperature within the thermal fixing unit body 39 through the interface 53 to the microcomputer 51.

Furthermore, the heater 34, the blower fan 36, the deodorizer fan 43 and the like are connected through the interface 53 to the microcomputer 51.

In the thus constructed copying machine, in case of formation of a color copy, when the power switch of the copying machine is turned on, the microcomputer 51 operates the heater 34 and the blower fan 36 in accordance with the mode selected on the basis of the operation of the mode changing switch 54, thereby elevating the temperature within the body 39. In response to the input signal from the thermistor 155, the microcomputer 51 controls the ON/OFF of the heater 34, so that the interior of the body 51 is kept at a constant temperature in response to the selected mode. At this time, the deodorizer fan 43 is kept in the stop condition by the microcomputer 51, to thereby effectively perform the heating operation.

Subsequently, when the start switch 52 is operated, the microcomputer 51 controls the original moving unit (not shown in FIG. 7) to thereby move the original base glass 2 rightwardly to the movement end. At the same time, the feed-in rollers 21 are operated to move the developer sheet 17 to the inlet portion of the pressure developing unit 19. The operation following this is substantially the same as that of the first embodiment.

On the other hand, when the operational mode is changed, for example, from the high shiny mode to the low shiny mode, i.e., from the OHP mode to the high shiny mode or from the OHP mode to the low shiny mode by the operation of the mode changing switch 54, the microcomputer 51 operates the fan 43 for a predetermined time and at the same time causes the heater 34 to operate. Consequently, the operation of the deodorizer fan 43 assists the diffusion of the heat within the thermal fixing unit body 39, to thereby shorten a period of time needed for the mode change.

Inversely, when the operational mode is changed from the lower temperature mode to the high temperature mode, not only the microcomputer 51 causes the heater 34 to operates but also causes the operation of the deodorizer fan 43 to stop during the mode changing operation. Consequently, due to the operational stop of the deodorizer fan 43, the diffusion of heat within the thermal fixing unit body 39 is controlled to shorten the time needed for the mode change.

As described above, according to this embodiment, the odor of the gas generated from the developer sheet 17 by the heating of the developer sheet 17 may be removed without fail. Further, the deodorizer fan 43 needed for removing the odor is controlled during the starting operation of the thermal fixing unit 23 and during the switching-over of the heating modes, so that the time needed for controlling the temperature may be shortened. Accordingly, it is possible to perform a rapid and smooth starting operation and a mode switching operation. The energy consumption may be suppressed during the starting operation of the thermal fixing unit 23 and the mode switching-over operation from the low temperature mode to the high temperature mode.

It is possible for those skilled in the art to modify the system within the spirit of the invention. For example, the filter 45 may be provided outside of the copying machine body and the suction means is composed only of the deodorizer fan 43 or to reduce the number of the operational modes. Of course, the invention may be applied to a monochromatic copying machine.

Referring back to FIG. 7, a non-volatile memory 51a provided in the microcomputer 51 will be described. The memory 51a has storage locations for storing a total number of copies. To the microcomputer 51, a start switch 52 is connected through the interface 53 for producing a copy start signal when depressed. When the start switch 52 is depressed, the copied number to be stored in the nonvolatile memory 51a is incremented. If the copied number stored in the memory 51a exceeds a predetermined number, a warning signal is fed to a display 61 for warning the operator to change the filter and the copying machine is held in a preparatory condition where the copying machine will not work even if the start switch 52 is operated. When the warning lamp is turned on, the operator must replace the filter 45 by a new one. When the filter 45 is changed, the copied number stored in the memory 51a is cleared.

In the case where the copied number has not exceeded the predetermined number or the filter 45 is replaced by a new one, the foregoing operation is to be performed when the start switch 52 is turned on.

In this embodiment, it is possible to modify the machine so that a gas detecting means such as a gas sensor may be used in place of the accumulation copy number storing means. Namely, when the service life of the filter 45 is close to the end thereof, the amount of components which are contained in the gas passing through the filter and are to be removed is increased. The amount (or rate) thereof is measured so that the service life of the filter may be detected.

Furthermore, an indicator lamp 62 for indicating an abnormal condition of the copying machine is connected through the interface 53 to the microcomputer 51.

Figure 8:
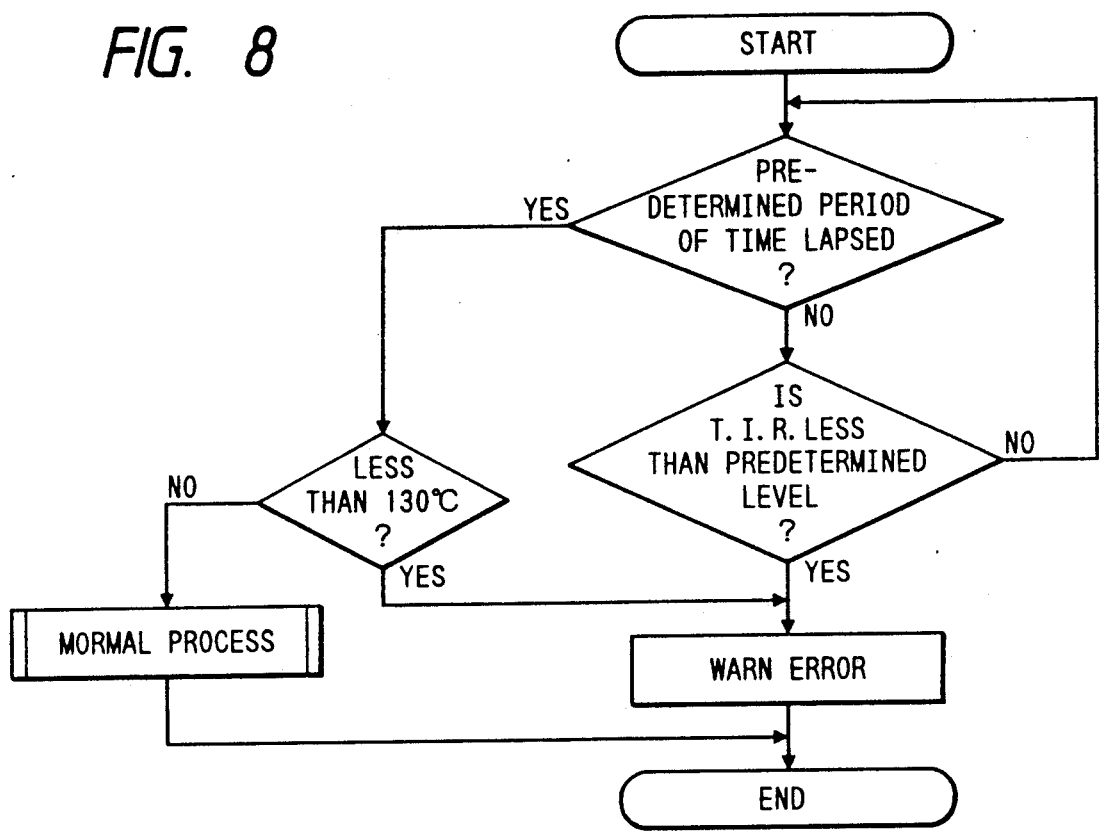
FIG. 8 is a flowchart showing a filter change operation according to the invention.

Referring to FIG. 8, the operation of the indicator lamp 62 will be described. In the copying machine, when the electric source switch of the copying machine is first turned on, the heater 34 and the fan 43 are turned on in accordance with a selected operational mode, so that the temperature within the body 39 is increased and the air is discharged by the fan 43.

Figure 9:
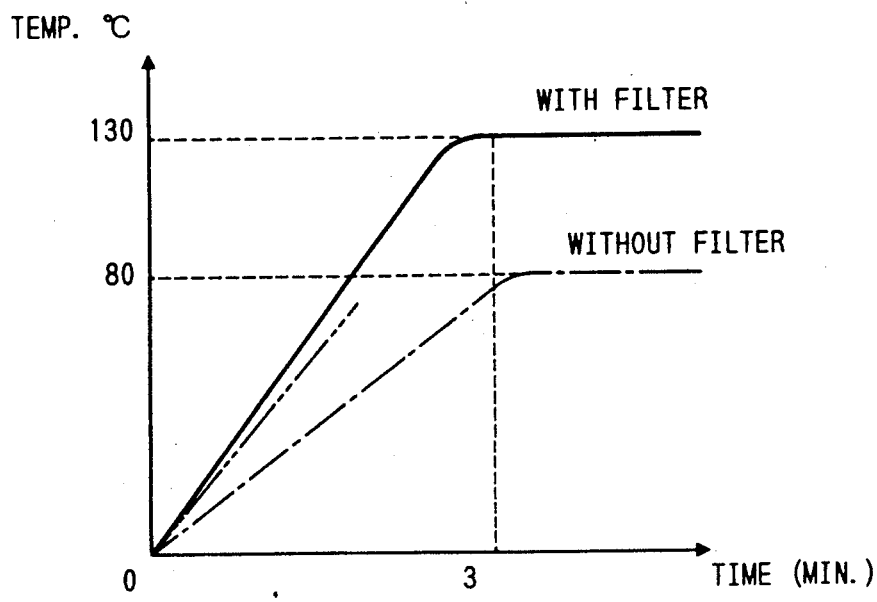
FIG. 9 is a graph showing a difference in temperature between the filter provision and no filter provision.

Then, the microcomputer checks whether or not the temperature increasing rate is held within a predetermined level on the basis of the detection signal of the thermistor 155 corresponding to the temperature within the thermal fixing unit 23, that is, whether a deodorizing filter 45 is mounted. More specifically, as shown in FIG. 9, in the case where the deodorizing filter 45 is mounted, since the amount of the gas discharged in a unit time is restricted by the filter 45, the temperature increasing rate exceeds a predetermined level indicated by two-dot and dash line. Inversely, in the case where no filter is mounted, as indicated by a one-dot-and-dash line, the amount of the discharged gas is not restricted, so that the temperature increasing rate is reduced below the predetermined level. Accordingly, the provision of the deodorizing filter 45 may be detected.

If the microcomputer 51 determines that the temperature increasing rate is less than the predetermined level, the microcomputer 51 causes the heater 34, the blower fan 36 and the fan 43 to stop and the indicator lamp to light to indicate that the filter 45 is not mounted.

Also, when a predetermined time period (three minutes in the embodiment) has elapsed after the turn-on of the electric source switch, the microcomputer 51 checks whether the temperature in the thermal fixing unit 23 is less than 130° C. In the case where it is less than 130° C., in the same manner, the heater 34, the feed fan 36 and the fan 43 are stopped and at the same time, the indicator lamp 62 is intermittently turned on to thereby indicate the abnormality.

As described above, according to the invention, the temperature in the thermal fixing unit 23 upstream of the deodorizing filter 45 is detected by the thermistor 155, and it is possible to detect the provision of the deodorizing filter 45 by the magnitude of the temperature increasing rate calculated based upon the detection of the thermistor 155. In the case where the filter 45 is not mounted, the heater 34, the air feed fan 36 and the blower fan 43 are stopped, to thereby suppress the consumption of the energy. Also, in the case where the filter 45 is not mounted, the indicator lamp 62 is turned on to thereby indicate to the operator the fact that the filter 45 is not mounted. Accordingly, after the used deodorizing filter is removed during the replacement work, it is possible to prevent the operator from forgetting the mounting of a new deodorizing filter.

Also, according to the invention, the thermistor 155 for controlling the temperature of the thermal fixing unit 23 is used for detecting the provision of the deodorizing filter 45. Accordingly, it is unnecessary to provide another temperature sensor specially for detecting the provision of the deodorizing filter 45, thus reducing the manufacturing cost.

Also, if the temperature within the thermal fixing unit 23 is less than a predetermined temperature (130° C.), when a predetermined period (i.e., three minutes in this case) has elapsed after the turn-on of the electric source switch, the heater 34, the air feed fan 36 and the blower fan 43 are stopped, and at the same time, the indicator lamp 62 flickers to thereby indicate the abnormality. Thus, the energy may be saved and the need to conduct a maintenance is warned to the operator.

Incidentally, the arrangement of the thermistor 155 for detecting the temperature within the thermal fixing unit 23 is not limited to that shown in FIG. 5. For instance, in addition to the thermistor 155, another thermistor is provided for detecting the temperature within the duct 44 to thereby obtain the temperature increasing rate of the thermal fixing unit 23 on the basis of the temperature increasing rate of the duct 44, thus judging whether the deodorizing filter 45 is mounted or not.

Also, in the foregoing embodiment, the indicator lamp 56 is turned on, thus warning to the operator the fact that the deodorizing filter 45 is not mounted. This may readily be modified by providing a warning buzzer instead of the warning lamp 62. Also, the indicator lamp 62 itself may be omitted.

What is claimed is:

1. A thermal fixing device for thermally fixing and accelerating coloring of an image formed on a sheet (17), comprising:

delivery means (32, 33) for delivering the sheet (17) along a delivery path;

heating means (34) disposed on said delivery path of the sheet (17) for heating said sheet;

a device body (39) incorporating said heating means (34) therein and provided with an inlet (37) and an outlet (38) through which the sheet (17) is delivered;

suction means (43, 45) connected to said inlet and outlet (37, 38) for sucking a gas, generated from the sheet (17) when heated, through said inlet and outlet and vicinities of said inlet and outlet, thereby discharging the gas to an outside of the device body (39);

temperature setting means (51) for selectively setting one of a plurality of heating temperatures; and control means (51) for controlling said heating means (34) and said suction means (43, 45) in response to the temperature set by said setting means (51).

2. A thermal fixing device for thermally fixing and accelerating coloring of an image formed on a sheet (17), comprising:

delivery means (32, 33) for delivering the sheet (17) along a delivery path;

heating means (34) disposed on said delivery path of the sheet (17) for heating said sheet;

a device body (39) incorporating said heating means (34) therein and provided with an inlet (37) and an outlet (38) through which the sheet (17) is delivered;

suction means (43, 45) connected to said inlet and outlet (37, 38) for sucking a gas, generated from the sheet (17) when heated, through said inlet and outlet (37, 38) and vicinities of said inlet and outlet, thereby discharging the gas to an outside of the device body (39); and control means (51) for operating said suction means (43, 45) only when said sheet (17) passes through said device body (39) in accordance with the operation of said delivery means (32, 33).

3. An image forming apparatus wherein a gas containing odorous components is generated during an image forming process, comprising:

a filter disposed in a vent path of said gas;

means for detecting that a service life of said filter is ended based on a copy amount resulting from a total number of copies; and processor means for carrying out a predetermined process in response to a result of a detection of said detecting means.

4. A thermal fixing device comprising:

a device body (39) covering a delivery path of a sheet (17) and provided with an inlet (37) and an outlet (38) through which the sheet (17) is delivered;

heating means for heating an interior of said device body (39) to thermally fix an image formed on the sheet (17);

discharge means (43, 44) connected to said inlet and outlet (37, 38) for forcibly discharging a gas generated when the sheet (17) is heated to the outside of said device body;

a deodorizing filter (45) mounted on said discharge means (43, 44) for removing smelling of the gas;

temperature detecting means (155) disposed upstream of said deodorizing filter;

calculating means (51) for calculating a temperature increasing rate within said device body (39) on the basis of a detection result of said temperature detecting means (55);

judging means (51) for judging that no deodorizing filter is mounted in the case where a calculating result of said calculating means (51); and warning means (62) for warning, on the basis of a judging result of said judging means (51), the fact that the deodorizing filter (45) is not mounted.

5. A thermal fixing device for thermally fixing and accelerating coloring of an image on a developer sheet, comprising:

means for heating said developer sheet to thermally fix and accelerate coloring of the image on the developer sheet;

delivery means for delivering said developer sheet through said heating means;

covering means for substantially covering said heating means, said covering means further including a cover for covering said heating means and rollers for effectively isolating said heating means in cooperation with said cover; and discharge means for discharging a gas generated from said developer sheet, said discharging means being connected to said covering means.

6. A device according to claim 5, wherein said heating means includes a heater and a rotary fan.

7. A device according to claim 5, wherein said discharge means includes a blower fan and a filter disposed on a discharge side of said blower fan.

8. A device according to claim 5, further comprising temperature setting means for selectively setting one of a plurality of heating temperatures; and control means for controlling said heating means and said discharge means in response to the temperature set by said setting means.

9. A device according to claim 5, further comprising control means for operating said discharge means only when said sheet passes through said covering means in accordance with the operation of said delivery means.

10. A device according to claim 7, further comprising means for detecting that the service life of said filter is ended based on a copy amount resulting from a total number of copies; and processor means for carrying out a predetermined process in response to a result of a detection of said detecting means.

11. A device according to claim 7, further comprising temperature detecting means disposed upstream of said filter; and calculating means for calculating a temperature increasing rate within said covering means on the basis of a detection result of said temperature detecting means.

12. A device according to claim 11, further comprising judging means for judging that no filter is mounted in the discharge means based on a calculating result of said calculating means; and warning means for warning, on the basis of a judging result of said judging means, the fact that the filter is not mounted.

13. A device according to claim 7, further comprising:
- a gas sensor provided downstream of said filter;
- means for detecting that a service life of said filter is ended in response to a signal from said gas sensor; and
- processor means for carrying out a predetermined process in response to a result of a detection of said detecting means.

14. An image recording apparatus wherein a gas containing odorous components is generated during an image forming process, comprising:
- a filter disposed in a vent path of said gas;
- a gas sensor provided downstream of said filter;
- means for detecting that a service life of said filter is ended in response to a signal from said gas sensor; and
- processor means for carrying out a predetermined process in response to a result of a detection of said detecting means.

15. An image recording apparatus using a recording medium comprising an elongated continuous form photosensitive recording medium capable of receiving an image to be formed, and a cut sheet type of a developer recording medium which provides an output image upon reaction with the image formed on said photosensitive recording medium, and the recording medium being fed along a recording medium feeding path, the image recording apparatus comprising:
- exposing means, located alongside the recording medium feeding path, for superimposing said elongated continuous form photosensitive recording medium so as to form an image thereon;
- developing means disposed downstream of said exposing means with respect to recording medium feeding path, for developing the exposed photosensitive recording medium superimposed with the developer recording medium;
- separating means, disposed downstream of said developing means with respect to said recording medium feeding path, for separating said exposed photosensitive recording medium from said developer recording medium;
- thermal fixing means, disposed downstream of said exposing means with respect to said recording medium feeding path, for thermally fixing and accelerating coloring of an image formed on the developer recording medium; and
- removing means, disposed adjacent to said thermal fixing means, for removing a gas generated due to a temperature increase of said developer recording medium.

16. The image recording apparatus according to claim 15, wherein said thermal fixing means comprises:
- heating means for generating heat so as to heat said developer recording medium; and
- a device body incorporating said heating means therein and provided with an inlet and an outlet through which said developer recording medium is delivered; and wherein said removing means comprises:
- suction means connected to said inlet and said outlet for sucking a gas generated by said developer recording medium when heated, through said inlet and said outlet and vicinities of said inlet and said outlet, thereby discharging said gas to the outside of the device body; and
- a filter disposed on a discharge side of said suction means for removing an odor of said gas.

17. The image recording apparatus according to claim 16, wherein said heating means comprises spraying means for spraying heated air into said developer recording medium and wherein said removing means is mounted in a path of said heated air sprayed onto said developer recording medium by said heating means, said heated air being leaked through said path to the outside.

18. The image recording apparatus according to claim 17, wherein said gas is generated in said device body caused by the spraying of said heated air.

19. A thermal fixing device for thermally fixing and accelerating coloring of an image on a developer sheet, comprising:
- means for heating said developer sheet to thermally fix and accelerate coloring of the image on the developer sheet, said heating means comprising a heater and a rotary fan;
- delivery means for delivering said developer sheet through said heating means;
- covering means for substantially covering said heating means; and
- discharging means for discharging a gas generated from said developer sheet, said discharging means being connected to said covering means.

20. A thermal fixing device for thermally fixing and accelerating coloring of an image on a developer sheet, comprising:
- means for heating said developer sheet to thermally fix and accelerate coloring of the image on the developer sheet;
- delivery means for delivering said developer sheet through said heating means;
- covering means for substantially covering said heating means;
- discharge means for discharging a gas generated from said developer sheet, said discharging means being connected to said covering means;
- temperature setting means for selectively setting one of a plurality of heating temperatures; and
- control means for controlling said discharge means and said heating means in response to the temperature set by said setting means.

21. A thermal fixing device for thermally fixing and accelerating coloring of an image on a developer sheet, comprising:
- means for heating said developer sheet to thermally fix and accelerate coloring of the image on the developer sheet;
- delivery means for delivering said developer sheet through said heating means;
- covering means for substantially covering said heating means;

discharge means for discharging a gas generated from said developer sheet, said discharging means being connected to said covering means; and control means for operating said discharge means only when said sheet passes through said covering means in accordance with the operation of said delivery means.

22. A thermal fixing device for thermally fixing and accelerating coloring of an image on a developer sheet, comprising:

means for heating said developer sheet to thermally fix and accelerate coloring of the image on the developer sheet.

delivery means for delivering said developer sheet through said heating means;

covering means for substantially covering said heating means;

discharge means for discharging a gas generated from said developer sheet, said discharging means being connected to said covering means and including a blower fan and a filter disposed on a discharge side of said blower fan;

temperature detecting means disposed upstream of said filter; and calculating means for calculating a temperature increasing rate within said covering means on the basis of a detection result of said temperature detecting means;

23. A thermal fixing device for thermally fixing and accelerating coloring of an image on a developer sheet, comprising:

means for heating said developer sheet to thermally fix and accelerate coloring of the image on the developer sheet;

delivery means for delivering said developer sheet through said heating means;

covering means for substantially covering said heating means;

discharge means for discharging a gas generated from said developer sheet, said discharging means being connected to said covering means and including a blower fan and a filter disposed on a discharge side of said blower fan;

temperature detecting means disposed upstream of said filter;

calculating means for calculating a temperature increasing rate within said covering means on the basis of a detection result of said temperature detecting means;

judging means for judging that no filter is mounted in said discharge means based on a calculating result of said calculating means; and warning means for warning, on the basis of a judging result of said judging means, the fact that said filter is not mounted.

* * * * *